United States Patent [19] BEST AVAILABLE COPY [11] 3,895,266
Geiger [45] July 15, 1975

[54] MODULAR PRINTED ASSEMBLIES FOR COMMUNICATION RECEIVERS

[75] Inventor: Erich Geiger, Friesen, Germany

[73] Assignee: Loewe-Opta GmbH., Kronach, Germany

[22] Filed: Dec. 14, 1973

[21] Appl. No.: 424,751

[30] Foreign Application Priority Data

Dec. 14, 1972 Germany ............................ 2261130

[52] U.S. Cl. .................... 317/101 DH; 339/176 MP
[51] Int. Cl. ............................................. H02b 1/02
[58] Field of Search ............... 317/101 DH, 101 CC; 339/176 MP, 17 M, 17 LM, 17 LC

[56] References Cited

UNITED STATES PATENTS

| | | | |
|---|---|---|---|
| 2,730,683 | 1/1956 | Ayres et al. | 339/176 MP |
| 3,270,311 | 8/1966 | Deer et al. | 339/176 MP |
| 3,591,834 | 7/1971 | Kolias | 317/101 DH |

*Primary Examiner*—David Smith, Jr.

[57] ABSTRACT

A multi-board printed circuit assembly is constructed in modular form, with the modules being interconnected in a mechanically rigid co-planar lattice. Each module is formed by removably supporting the end terminal regions of individual pairs of the boards in a common plane within a housing. A first insulating member of the housing carries a bridging contact element, whose ends are urged against the terminal regions of the respective boards by the cooperative action of the first member and of a second insulating housing member to which the first member is removably secured. The opposite side walls of the first member isolates the terminal regions of the boards from the influx of solder during a subsequent dip-soldering operation that connects selected circuits on the secured boards to corresponding elements on a chassis.

2 Claims, 6 Drawing Figures

MODULAR PRINTED ASSEMBLIES FOR COMMUNICATION RECEIVERS

BACKGROUND OF THE INVENTION

In recent years the assembly of complicated communication apparatus, such as television receivers, has been greatly facilitated by employing assemblies of printed circuit boards whose circuits may be joined to associated electrical elements on a chassis (e.g., by dip-soldering operations).

Certain designs of such printed circuit assemblies have exhibited disadvantages such as a) poor accessibility of the individual circuit boards for test and replacement purposes, b) excessive physical size and mechanical fragility, particularly in older constructions wherein the printed circuit boards were secured to perpendicularly disposed ground planes. Some of these problems, particularly those of accessibility, have been avoided in more recent constructions that employ pluggable or other removable connections of the terminal areas of adjacent circuit boards, which are arranged in spaced relation in parallel planes.

Despite such improvements, even the most advantageous of the known techniques have severe limitations, particularly in their mechanical features. For example, in the parallel plane arrangement just referred to, severe problems have been encountered in aligning each of the boards in the required parallel relation prior to soldering, and the resulting assembly exhibits a relatively small mechanical rigidity. Such technique has the further disadvantage of requiring separate dip-soldering operations to connect the selected circuits on each separate plane of the printed circuit boards to corresponding electrical elements on the chassis.

SUMMARY OF THE INVENTION

The improved electrical construction of the invention avoids these problems by arranging the printed circuit boards in a plurality of co-planar modules which may be interconnected to form a unitary assembly having a high mechanical rigidity. The planar nature of such unitary assembly permits the subsequent joining of selected circuits of all the boards in the assembly with corresponding elements on a chassis frame in a single dip-soldering operation.

In this construction, individual pairs of the circuit boards to be interconnected are removably secured in co-planar relation in a housing to form a separate module. Each housing includes a plurality of interconnected insulating members which are a part of, or joinable to, a lattice plane so that each module may be accurately aligned in a common plane prior to the solder operation. The resulting modules may then be interconnected with each other in the common plane to provide a mechanically rigid lattice construction.

In general, a first insulating member of each housing straddles the associated regions of the circuit boards. The first member carries a bridging electrical contact that is firmly urged into engagement at its opposite ends with the terminal regions of the adjacent boards to provide the required electrical interconnection therebetween. Such first member is also provided with opposed side walls that contact the supported circuit boards to isolate their interconnected terminal regions from the solder medium employed in the subsequent dip-soldering operation. This isolation assures easy disengagability of the module components for replacement and/or test purposes.

A second insulating member of each housing is removably secured to the first member to rigidly support the adjacent ends of the circuit boards in the common plane and to provide firm contact between the bridging contact elements and the terminal regions of the boards.

In an exemplary embodiment, the terminal regions of each of the boards are provided with receptacles having upwardly extending socketed portions. The ends of the bridging contact elements of the housing are insertable in the socketed ends of the receptacles to form a plug connection between the boards. The lower surfaces of the receptacles are supported on shoulders extending from the sides of a U-shaped strap which forms the second insulating member of the housing, and which may also define part of a lattice frame.

BRIEF DESCRIPTION OF THE DRAWING

The invention is further set forth in the following detailed description taken in conjunction with the appended drawing, in which.

DETAILED DESCRIPTION

Figure 1:
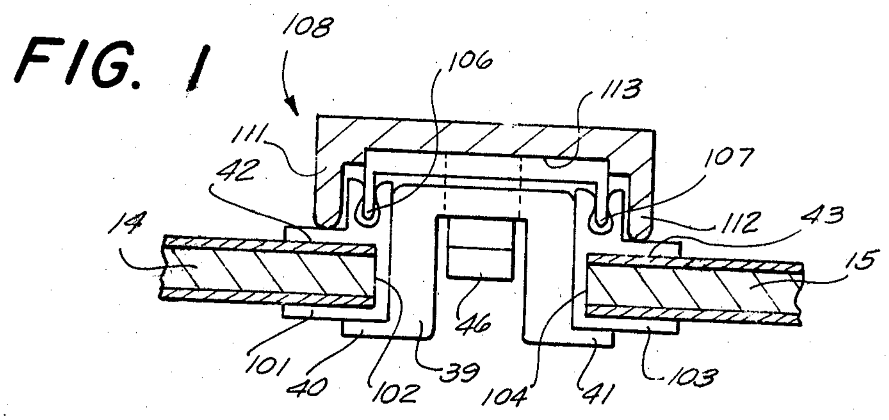
FIG. 1 is a side view, partly in section, of a first form of printed circuit module in accordance with the invention for use with doubly-clad printed circuit boards, wherein one of the insulating elements of the module housing forms part of a lattice frame.

Referring now to the drawing, FIG. 1 illustrates a pair of doubly-clad printed circuit boards 14, 15 which are to be simultaneously connected electrically and supported mechanically as part of a modular assembly 100. A conductive receptacle 101 is secured over an end 102 of the board 14 in contact with a terminal region 42 thereof. Simularly, a conductive receptacle 103 is secured over an end 104 of the board 15 in contact with a terminal region 43 thereof. The receptacles 101 and 103 respectively include upwardly extending socketed portions 106 and 107, which are used to provide disconnectable plug joints as explained below.

The module 100 includes a housing 108 which supports the terminal regions 42 and 43 of the boards 14 and 15 in a common plane. For this purpose the housing includes a first recessed insulating member 45, shown in the form of a protective cap. The cap 45 has side walls 111 and 112 which straddle the socketed portions 106 and 107 of the receptacles 101 and 103 and contact the adjacent portions of the boards 14 and 15. Such contact between the cap and the boards is made sufficiently tight to form an effective solder seal, whereby during a subsequent dip solder operation to connect selected circuits on the boards 14 and 15 to suitable electrical elements on a chassis, the solder mediums employed in such operation is prevented from penetrating inside the housing 108. Such penetration, of course, could permanently seal any plug joints formed in the socketed regions 106 and 107 and destroy the desired interchangability of the asembly.

A bridging contact element 44 is securely carried in a recesses area 113 of the cap 45. The element 44 has downwardly extending opposed ends 116 and 117 which cooperate with the socketed areas 106 and 107 to form the above-mentioned disconnectable plug joints between the circuit boards 14 and 15.

The housing 108 further includes a second insulating member 39 defined by a U-shaped strap. The strap 39 has shoulders 40, 41 extending in opposite directions from opposite side walls thereof for supporting the bottom surfaces of the respective receptacles 101 and 103. The strap 39 is removably secured to the cap 45 via a plurality of tabs 46 (one of which is shown) in order to *a*) rigidly support the boards 14 and 15 in the co-planar relationship shown and *b*) simultaneously urge the bridging contact element 44 tightly into the socketed portions 106, 107, so that high mechanical and electrical stability is assured. The tab 46 may be affixed as shown to the cap 45 and extend through a suitable aperture in the top surface of the strap 39.

In one particularly advantageous construction in accordance with the invention, a plurality of the modules 100 may be rigidly interconnected in the common plane of the boards to form a highly stable lattice structure. In addition to increased rigidity, the planar nature of resulting assembly permits the use of a single dip-solder operation to couple selected circuits of the interconnected boards to appropriate electrical elements of a communication chassis.

Figure 2:
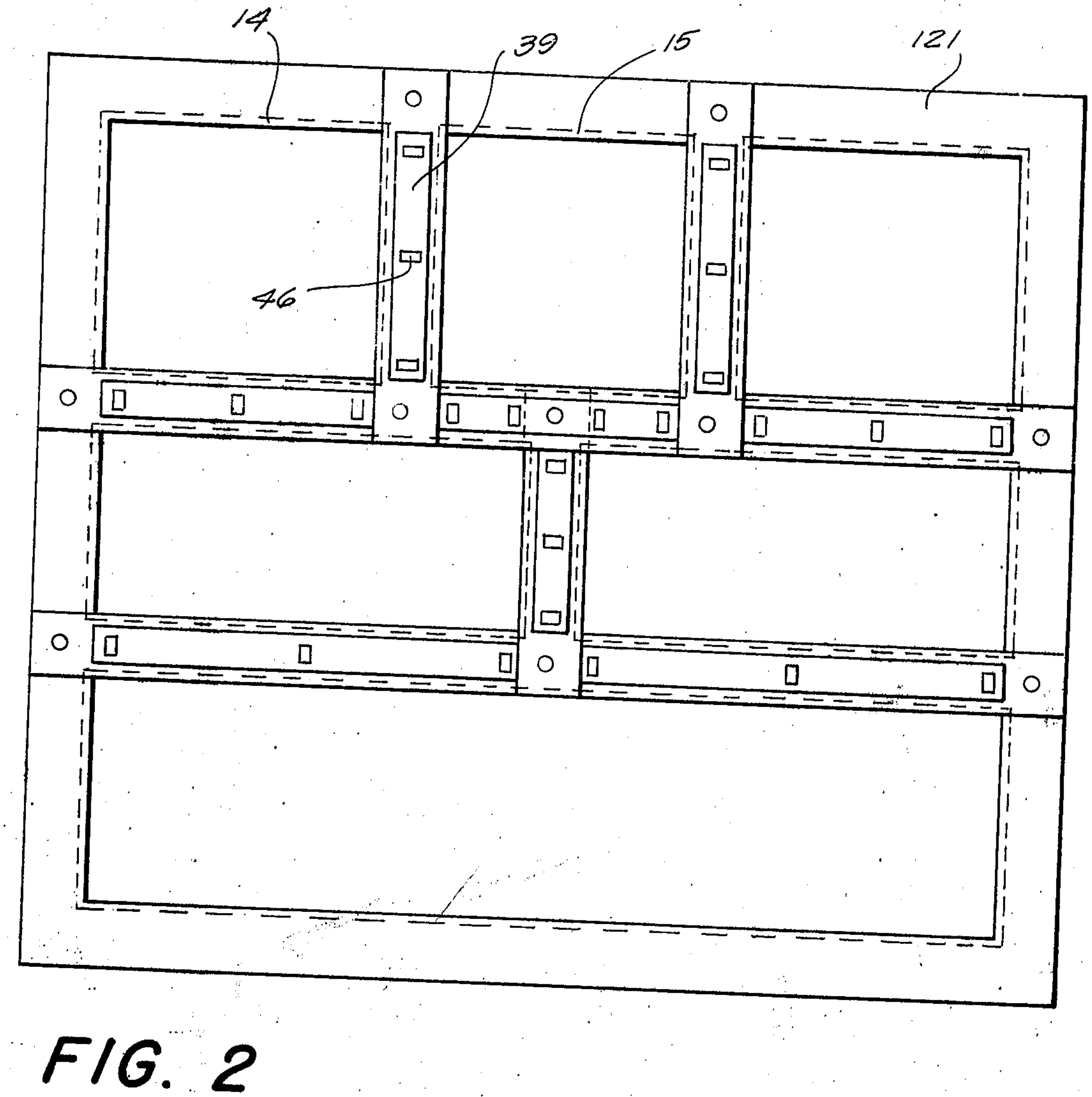
FIG. 2 is a bottom view of a lattice frame formed from insulating elements associated with an interconnected plurality of modules of the type shown in FIG. 1.

One form of such resulting lattice structure is shown in FIG. 2, and employs an assembly of six printed circuit boards of various sizes. The straps 39 of each module are interconnected on a frame 121 to serve as a supporting gridwork for the modular lattice.

Figure 3:
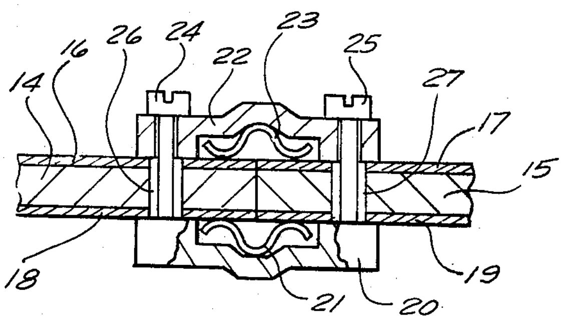
FIGS. 3 – 4 are side views, partly in section, of alternative forms of modules in accordance with the invention for use with doubly-clad circuit boards.

FIG. 3 shows a second embodiment of a co-planar module in accordance with the invention. In this case, the terminal regions of the doubly-clad boards are flush with the cladding, and the boards are supported in abutting relation. The housing of the module includes upper and lower, recessed, vertically aligned insulating caps 22, 20. The caps are removably secured to each other by screws 24, 25 extending through holes 26, 27 in the respective boards 14, 15. A pair of generally U-shaped springs 21, 23 carried in recesses of the respective caps 20, 22 serve as lower and upper bridging contact elements. The opposite ends of each such spring engages and interconnects the adjacent terminal regions on the corresponding clad surfaces of the boards 14, 15. Firm pressure of the spring ends on such terminal regions, together with firm mechanical support of the boards, is assured by a suitable degree of tightening of the screws 24, 25.

Figure 4:
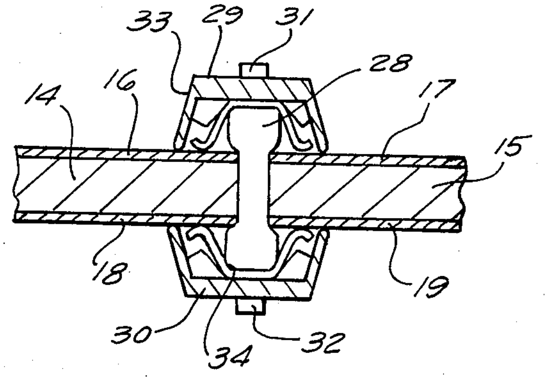

In the arrangement shown in FIG. 4, the doubly-clad boards 14 and 15 are initially supported in co-planar relation by having their respective opposed ends wedged in opposite recessed sides of a central insulating spacer 28 (in an appropriate case, the spacer 28 may form part of an integral lattice gridwork similar to that of FIG. 2). A pair of protective caps 29, 30 respectively straddle upper and lower terminal regions 16, 17 and 18, 19 of the boards 14, 15, and are aligned in a plane perpendicular to the common plane of the boards. The opposed side walls of respective caps seal off the housed terminal regions of the boards 14, 15 from an influx of solder. Upper and lower bridging contact elements 33, 34 are carried in recesses in the respective caps 29, 30 for electrically joining the terminal regions of the boards 14, 15. Such boards are rigidly secured electrically and mechanically in the illustrated module by removably securing each of the caps 29, 30 to the central spacer 28 via suitable tabs 31, 32.

Figure 5:
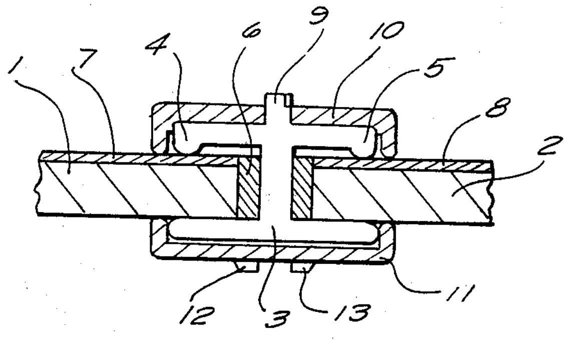
FIGS. 5 and 6 are side views, partly in section, of alternative forms of modules in accordance with the invention for use with singly-clad circuit boards.
Figure 6:
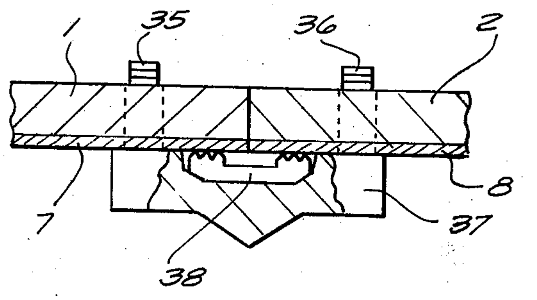

FIGS. 5 and 6 illustrate embodiments of the modular construction in accordance with the invention for use with singly-cladded printed circuit boards 1, 2. In FIG. 5, an apertured insulating spacer 6 maintains terminal regions 7, 8 of the boards 1, 2 in spaced relation. Vertically aligned insulating caps 10, 11 straddle the terminal regions 7, 8 and have side walls contacting the boards to provide solder seals in the manner indicated above. A generally H-shaped bridging contact element 3 is carried in an internal chamber of the module housing, such chamber being formed by opposed recesses in the caps 10, 11 and the aperture in the spacer 8. An upper leg of the element 3 has apposed ends 4, 5 which respectively contact the terminal regions 7, 8. In order to provide the required electrical and mechanical stability of the module, a projection 9 on the upper end of the element 3 may be secured in an aperture of the upper cap 10, while a pair of tabs 12, 13 extend through apertures (not shown) in the lower leg of the element 3 to be secured to the spacer 6.

In the construction shown in FIG. 6, the boards 1, 2 are disposed in abutting relation in the module. A single protective cap 37 straddles the terminal regions 7, 8 of the abutting boards. The opposed side walls of the cap 37 engage the respective boards to provide a solder seal. A bridging contact element 38 is carried in a recess of the cap 37, and is provided with sawtooth-shaped opposed ends to firmly grip the terminal regions 7, 8. The module is completed by a pair of dielectric securing members 35, 36 extending through holes in the boards 1, 2 and into removable engagement with the opposed side walls of the cap 37.

In the foregoing, the invention has been described in connection with illustrative arrangements thereof. Many variations and modifications will now occur to those skilled in the art. It is accordingly desired that the scope of the appended claims not be limited to the specific disclosure herein contained.

What is claimed is:

1. In an electrical construction for a communication receiver, a circuit module arranged for interconnection with similar modules to form a rigid assembly, which comprises, in combination, first and second printed circuit boards each having a terminal region at a first end thereof and a conductively clad first side, each terminal region including a receptacle surrounding and secured to the associated first end and having a socketed surface extending upwardly from the first side of the associated circuit board; bridging contact means having projecting opposite ends; an insulating member carrying the bridging contact means and straddling the receptacles of the respective circuit boards for effecting removable engagement of the projecting opposite ends of the bridging contact means with the socketed surfaces of the respective receptacles; a U-shaped strap having facilities for supporting the lower surfaces of the respective receptacles; and means for removably securing the insulating member to the strap.

2. A module as defined in claim 1, in which the insulating member has opposed side walls in contact with the first sides of the respective first and second circuit boards for sealing the terminal regions of the respective boards against an influx of solder.

* * * * *